(12) United States Patent
Oda

(10) Patent No.: US 7,154,547 B2
(45) Date of Patent: Dec. 26, 2006

(54) SOLID-STATE IMAGE SENSOR HAVING CONTROL CELLS FOR DEVELOPING SIGNALS FOR IMAGE-SHOOTING CONTROL UNDER POOR ILLUMINATION

(75) Inventor: Kazuya Oda, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 640 days.

(21) Appl. No.: 10/191,417

(22) Filed: Jul. 10, 2002

(65) Prior Publication Data
US 2003/0011693 A1 Jan. 16, 2003

(30) Foreign Application Priority Data
Jul. 13, 2001 (JP) .............................. 2001-213040

(51) Int. Cl.
H04N 9/04 (2006.01)
H04N 5/228 (2006.01)
H04N 5/232 (2006.01)
H04N 5/235 (2006.01)

(52) U.S. Cl. .................. 348/277; 348/222.1; 348/345; 348/362

(58) Field of Classification Search ................ 348/272, 348/276, 277, 345, 353, 354, 355, 216.1, 348/217.1, 362, 365, 366
See application file for complete search history.

(56) References Cited

U.S. PATENT DOCUMENTS 5,072,250 A * 12/1991 Makino ....................... 396/101
5,581,301 A * 12/1996 Ninomiya .................... 348/342
6,618,084 B1 * 9/2003 Rambaldi et al. ............ 348/247
6,727,948 B1 * 4/2004 Silverbrook ................. 348/345
6,734,913 B1 * 5/2004 Motta .......................... 348/362
6,829,008 B1 * 12/2004 Kondo et al. ................ 348/302
6,900,832 B1 * 5/2005 Yano ........................ 348/222.1
2002/0101532 A1 * 8/2002 Takayama et al. ........... 348/362
2002/0140824 A1 * 10/2002 Christoff et al. ......... 348/216.1

FOREIGN PATENT DOCUMENTS

| JP | 5-161078 | 6/1993 |
| JP | 7-203465 | 8/1995 |
| JP | 09218344 A * | 8/1997 |
| JP | 11-262025 | 9/1999 |

* cited by examiner

Primary Examiner—Ngoc-Yen Vu
Assistant Examiner—Adam L Henderson
(74) Attorney, Agent, or Firm—McGinn IP Law Group, PLLC

(57) ABSTRACT

A solid-state image sensor and a digital camera capable of executing accurate image-shooting adjustment even in a low illumination environment. A charge coupled device type of image sensor includes red, green and blue pixel cells provided with color filter segments and control cells not provided with color filter segments. When a controller determines that the illumination of a scene to be picked up is short, a digital signal processor generates estimated luminance and contrast values for automatic exposure and automatic focus controls in accordance with the outputs of the control cells. An exposure value and the focal position of a lens are adjusted in accordance with those estimated values. The scene is shot in the form of a still picture in response to a shutter release signal.

19 Claims, 11 Drawing Sheets

*Fig. 14*

| ADDRESS INFORMATION (H, V) | CELL ATTRIBUTE INFORMATION ||
|---|---|---|
| | DEFECTIVE CELL INFORMATION | CNTROL CELL INFORMATION |
| (2, 2) | 0 | 1 |
| (2, 6) | 0 | 1 |
| ⋮ | ⋮ | ⋮ |
| (4, 5) | 1 | 0 |
| (6, 2) | 0 | 1 |
| (6, 6) | 0 | 1 |
| (6, 10) | 1 | 1 |
| ⋮ | ⋮ | ⋮ |

Fig. 15     28

| DEFECTIVE CELL INFORMATION |
| CONTROL CELL INFORMATION |
| RESERVED |

SOLID-STATE IMAGE SENSOR HAVING CONTROL CELLS FOR DEVELOPING SIGNALS FOR IMAGE-SHOOTING CONTROL UNDER POOR ILLUMINATION

BACKGROUND OF THE INVENTION

1. Field of the Invention

The present invention relates to a solid-state image sensor for producing image signals representative of an optical image such as a color still picture formed on an array of photosensitive cells thereof, and a digital camera using the same.

2. Description of the Background Art

Today, a digital camera loaded with a CCD (Charge Coupled Device), a MOS (Metal Oxide Semiconductor) or similar solid-state image sensor is extensively used. The number of pixels available with such an image sensor has recently become great enough to implement high-definition color pictures. On the other hand, the individual photosensitive cell included in the solid-state image sensor for photoelectric conversion is decreasing in size in parallel with an increase in pixel density and a decrease in the overall size of the camera and for the purpose of increasing yield. A decrease in cell size directly translates into a decrease in pixel size and therefore a decrease in sensitivity to light for a single cell. Moreover, to produce a color picture, primary-color or complementary-color filter segments are positioned in front of photodiodes, which constitute the cells. Each color filter segment reduces the quantity of light to reach the associated photodiode due to its spectral transmission characteristic. Consequently, a sufficient amount of information is not available when the camera picks up a scene in a low illumination environment.

Digital cameras may include image-shooting adjustment features such as AE (Automatic Exposure) and AF (Automatic Focus) controls by using image signals output from an image sensor. Japanese patent laid-open publication No. 161078/1993, for example, discloses an electronic still camera with a CCD image sensor configured to assign different shutter speeds between the odd- and even-numbered fields constituting a single frame. The resulting two photometric values are used to determine the lightness of a subject for thereby effecting AE control.

Also, the camera disclosed in the above prior art document has an AF control function for calculating an estimated contrast value on the basis of high frequency components separated from image signals. The camera then moves a lens included therein to a position where contrast is higher for thereby executing AF control. Further, the camera amplifies the level of each image signal with a variable gain in accordance with the signal level to thereby correct a luminance level and adjust white balance.

However, a problem with the conventional digital camera of the type described is that when the sensitivity of the cells is short, noise components relatively increase and make it difficult to accurately execute the pickup control. For example, when the camera picks up a scene around dark, at night or in a room, it is difficult for the camera to attain image signals of a luminance level high enough for accurate image-shooting adjustment due to the short illumination of the scene. In such a case, it has been customary to produce pixel signals in mixture in order to increase the quantity of information conveyed by the image signals, thereby promoting accurate image-shooting adjustment.

The conventional digital camera of the type described additionally has a function of compensating for defective pixels particular to the image sensor to thereby generate corrected image data. Japanese patent laid-open publication No. 203465/1995, for example, teaches a signal interpolation for interpolating defective signals derived from defective pixels, which are included in a single-chip color solid-state image sensor. Further, Japanese patent laid-open publication No. 262025/1999 proposes a picture interpolation for correcting the signals of defective pixels with pixel signals of the same color as the defective pixels.

However, the mixed-pixel read-out scheme needs the same transfer rate as the whole-pixel read-out scheme and is therefore lower in pixel transfer rate than skipped-pixel read-out scheme. The mixed-pixel read-out scheme therefore fails to smoothly display a movie on a monitor, e.g. before an actual shot. For example, with an image sensor having 1,280*1,024 effective pixels in which the mixed-pixel read-out is carried out with each four or eight pixels reduced to one, a pixel reading time is necessary as long as about $\frac{1}{7.5}$ second or $\frac{1}{15}$ second, respectively. The pixel output rate further decreases with an increase in pixel density.

With a digital camera having the one-to-eight pixel skipping scheme, in which all the pixels are read out so that every eight pixels are mixed into one, pixels eight times as many as the usual pixel skipping scheme have to be read out even in the one-to-eight mixed-pixel skipping mode. Although those pixels convey information eight times as much as the latter, the one-to-eight mixed-pixel skipping scheme needs the same read-out time as the whole-pixel read-out scheme. Moreover, even with the one-to-eight mixed-pixel skipping scheme, the required amount of information is not always available.

Under the above circumstances, it has been difficult to realize accurate AE and AF control without lowering the output rate in a dark place short of illumination. Particularly, when the illumination of a desired scene is low, noise components contained in the image signals relatively increase and thus lower the accuracy of control information for image-shooting adjustment.

Moreover, a color filter positioned on the array of photosensitive cells of a solid-state color image sensor lowers sensitivity by about one-third in the case of an R (red), G (green) and B (blue) or primary-color filter, compared to an image sensor without a color filter. Even a complementary-color filter lowers sensitivity by about one-half. The color filter therefore further obstructs accurate image-shooting adjustment in a poor illumination environment.

SUMMARY OF THE INVENTION

It is an object of the present invention to provide a solid-state image-shooting adjustment even in a poor illumination environment.

In accordance with the present invention, a solid-state image sensor includes a plurality of photoelectric conversion devices arranged in arrays for outputting color image signals representative of an optical image focused on the devices. A plurality of first cells each are located at a particular pixel position where a color filter segment is absent between the light incidence side and one photoelectric conversion device corresponding to the particular pixel position. The first cells each output a particular signal charge corresponding to the quality of light incident without the intermediary of a color filter segment. A plurality of second cells are located at pixel positions other than pixel positions where the first cells are located, and each output a particular second signal charge corresponding to the quantity of light incident via a color filter segment assigned to one photoelectric conversion device that forms the second cell. Charge transfer paths sequentially transfer the first signal charges and second signal charges in a vertical direction and a horizontal direction. An outputting device converts the first signal charges and second signal charges transferred via the charge transfer paths to electric signals.

Also, in accordance with the present invention, a digital camera receives an optical image via a lens and generates image signals representative of the optical image. An image sensor includes a plurality of first cells, which are not provided with color filter segments at the light incidence side, and a plurality of second cells, which are provided with color filter segments. The first cells and second cells each output a particular signal corresponding to the quantity of incident light. Signal processing circuitry processes signals readout from the image sensor for thereby generating pixel values pixel by pixel and generating, based on the pixel values, pixel signals representative of the optical image. A controller selectively executes first image-pickup control for mainly reading out the first signals from the first cells or second image-pickup control for reading out signals from the second cells in a movie mode. The controller includes a decision circuit for determining the quantity of light incident to the image sensor. When the decision circuit determines that the quantity of incident light is smaller than a preselected threshold value, the controller executes the first control to thereby establish image-pickup control on a basis of the first signals.

BRIEF DESCRIPTION OF THE DRAWINGS

The objects and features of the present invention will become more apparent from consideration of the following detailed description taken in conjunction with the accompanying drawings in which:

FIG. 14 lists specific cell information stored in a coordinates memory included in the illustrative embodiment;

FIG. 15 shows another specific format in which the cell information may be stored in the coordinates memory.

DESCRIPTION OF THE PREFERRED EMBODIMENT

Figure 1:
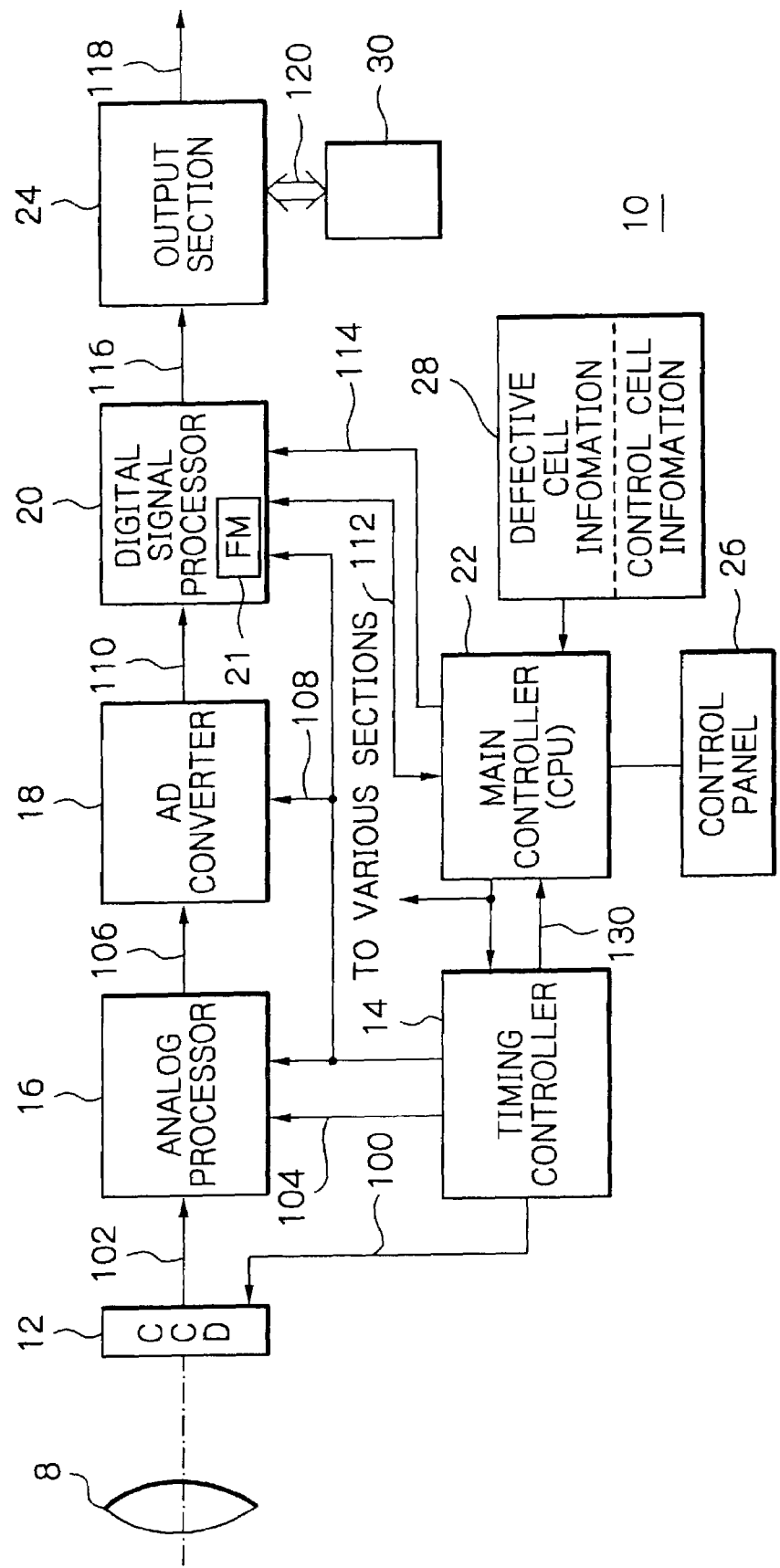
FIG. 1 is a schematic block diagram showing a preferred embodiment of a digital camera in accordance with the present invention.

Referring to FIG. 1 of the drawings, a digital camera, generally 10, in accordance with the present invention includes a lens 8 and a CCD (Charge Coupled Device) image sensor or solid-state image sensor 12. The digital camera 10 is adapted to capture a desired scene through the lens 8 by the CCD image sensor 12, which outputs corresponding image signals to be transformed to data representative of a color or a monochromatic still picture, which are in turn recorded in a memory card 30 removably mounted to thereto.

The camera 10 is selectively operable in a camera mode or a movie mode. In the camera mode, or still picture mode, the camera 10 picks up a scene, encodes resultant high-resolution image signals representative of the scene, e.g. as a still picture, and records the coded image data in the memory card 30. In the movie mode, the camera 10 continuously picks up a scene with low resolution for framing, focusing and other purposes while displaying consecutive pictures on its video monitor, not shown. In the illustrative embodiment, when the operator of the camera 10 turns on a power switch, not shown, provided on the camera 10, the camera 10 automatically sets up the movie mode. When the operator pushes a shutter release button, not shown, positioned on a control panel 26, the camera 10 sets up the camera mode. The operator can manually select or cancel the movie mode, as desired.

The camera 10 has an image-shooting adjusting function for effecting AF and AE controls and other adjustments in accordance with the output signal of the image sensor 12. As for AE control to be effected in an image-shooting adjustment mode, the camera 10 processes the output signals of the image sensor 12, measures the luminance level of a scene being picked up, and then controls a shutter speed and an F number in accordance with the luminance level. As for AF control to be also effected in the image-shooting adjustment mode, the camera 10 controls the axial position of the lens 8 in accordance with the output signals of the image sensor 12 such that a desired subject is focused on the photosensitive cell array of the image sensor 12.

The camera 10 intermittently executes the image-shooting adjustment over a movie mode period and can therefore perform AF and AE controls and other adjustments while monitoring a movie being picked up. Also, the camera 10 executes the image-shooting adjustment when the operator pushes the shutter release button, which is provided on a control panel 26, to its half stroke, for example. After the image-shooting adjustment, the operator may actually shoot a desired subject to obtain a still picture. More specifically, on the transition from the movie mode to the camera mode, the camera 10 processes one or more still pictures sequentially picked up and records the resulting image data in the memory card 30 while compressing or not compressing them. The memory card 30 is removably mounted to an output section 24 included in the camera 10.

When the camera 10 executes AF and AE controls and other image-shooting adjustments in a low illumination environment, the camera 10 controls the drive of the image sensor 12 and processes the output signals of the image sensor 12 in a low illumination mode unique to the illustrative embodiment. In addition, the camera 10 also operates in the low illumination mode when the operator selects a high shutter speed or a large F number. This is also true when the operator puts a neutral density filter in front of the lens 8 for a dimming purpose.

To implement the low illumination mode, high-sensitivity control cells are arranged on the array of photosensitive cells of the image sensor 12 in addition to usual pixel cells that output the pixel signals of an image formed by the light incident to the above array, as will be described later in detail. In the low illumination mode, the camera 10 executes image-shooting adjustment on the basis of or by mainly using the outputs of the control cells. It is to be noted that configurations of the camera 10 not directly relevant to the present invention are neither shown nor will be described. In the figures, signals are designated by reference numerals attached to connection lines on which they appear.

The CCD image sensor 12 will be described more specifically hereinafter. The image sensor 12 transduces an image representative of a scene and focused thereon via the lens 8 to corresponding electric signals. The image sensor 12 includes an array of photosensitive cells, a color filter array, vertical transfer CCDs, a horizontal transfer CCD, and an output amplifier. The photosensitive cell array has a plurality of photodiodes arranged vertically and horizontally and generates signal charges corresponding to the quantities of light incident to the photodiodes. The color filter array transmits the light incident to the photosensitive cell array with preselected spectral transmission characteristics.

The vertical transfer CCDs are adapted to transfer the signal charges output from the photodiodes in the vertical direction (V). The horizontal transfer CCD is adapted to transfer the signal charges delivered via the vertical transfer CCDs in the horizontal direction (H). The output amplifier converts the signal charges input via the horizontal transfer CCD to electric signals. If desired, the CCD image sensor 12 may be replaced with any other suitable solid-state image sensing device, e.g. a CMOS (Complementary Metal Oxide Semiconductor) image sensor.

Figure 2:
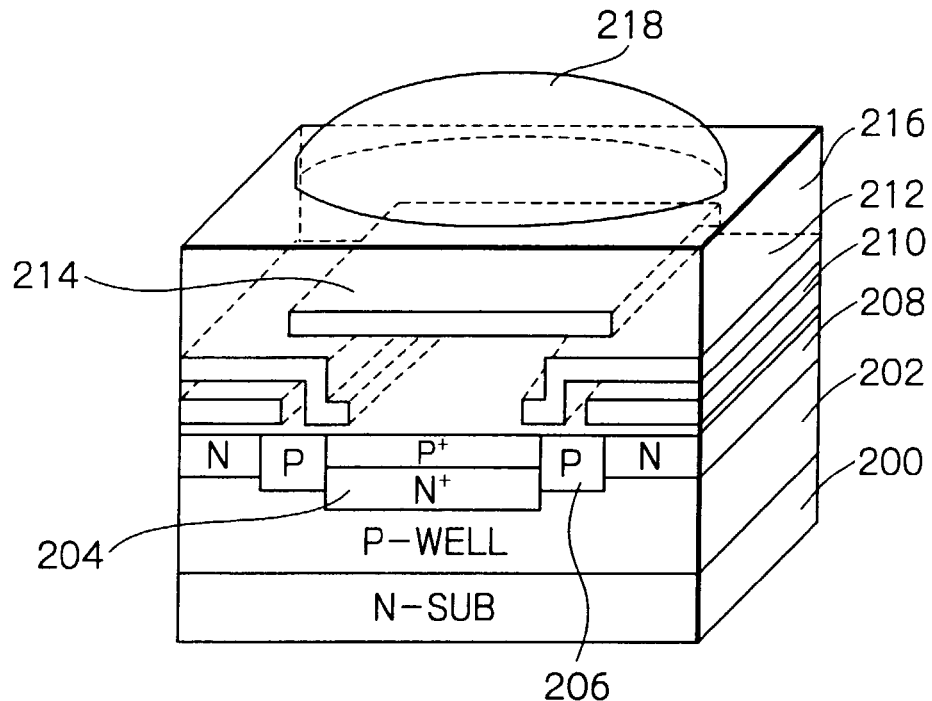
FIG. 2 is a fragmentary perspective view showing a photosensitive cell of a single pixel included in a solid-state image sensor forming part of the illustrative embodiment.
Figure 3:
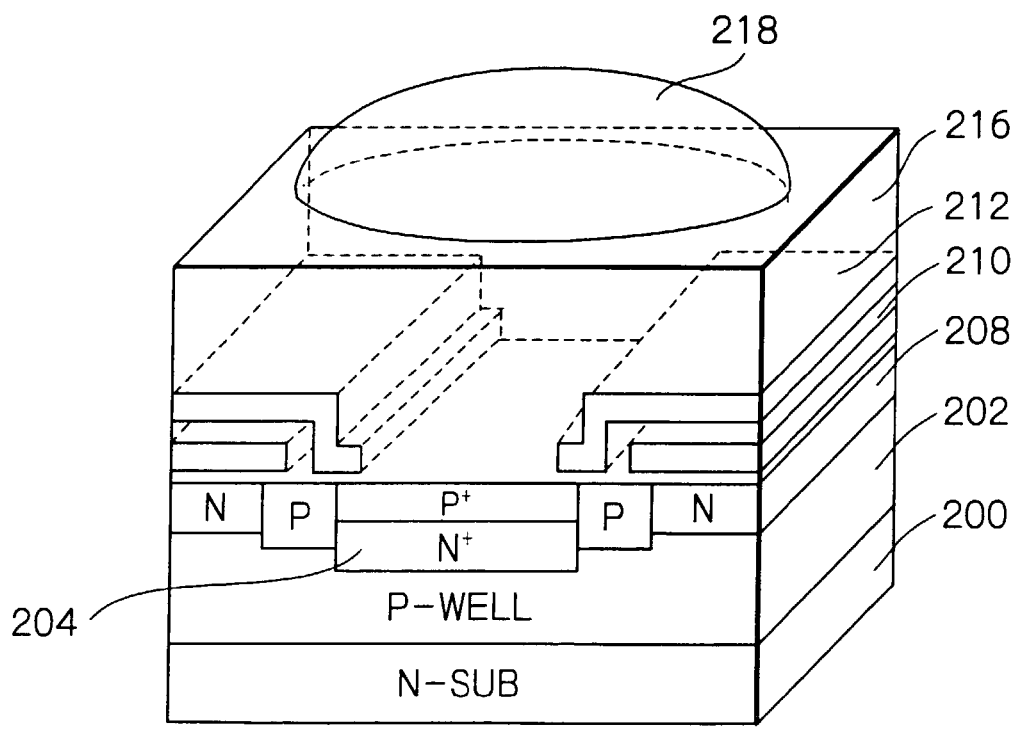
FIG. 3 is a view, similar to FIG. 2, showing a control cell also included in the image sensor.

FIGS. 2 and 3 are perspective views each showing part of the photosensitive cell array of the image sensor 12 around one of the pixel cells. As shown, the image sensor 12 includes an n-type substrate (N-Sub) 200 on which a p-well 202 is formed. In the p-well 202, a photodiode 204 has its PN junction formed. The photodiode 204 outputs a signal charge corresponding to the quantity of light incident thereto. The signal charge is shifted to a vertical transfer path 208 via a read-out gate 206 and then transferred along the path 208 in response to transfer pulses, which are input to a transfer electrode 210. A light-shielding film 212 is formed above the vertical transfer paths 208 and transfer electrodes 210 for preventing light from being incident to the paths 208.

The photodiode or photosensitive cell 204 not shielded by the light-shielding film 212 constitutes a pixel cell and generates a signal charge in the manner described above. Any one of R, G and B filter segments 214 is positioned above the photodiode 204, i.e. at the light incidence side in such a manner as to cover the photosensitive cell and light-shielding film 212. While the illustrative embodiment assigns a filter of particular primary color to each usual pixel cell, use may be made of color filter segments of complementary colors or different in spectral transmission characteristic from each other. A colorless, transparent overcoat layer 216 fills the space around the color filter 214. A microlens 218 is positioned on the overcoat layer 216 for focusing incident light on the photosensitive cell.

Figures 4, 5:
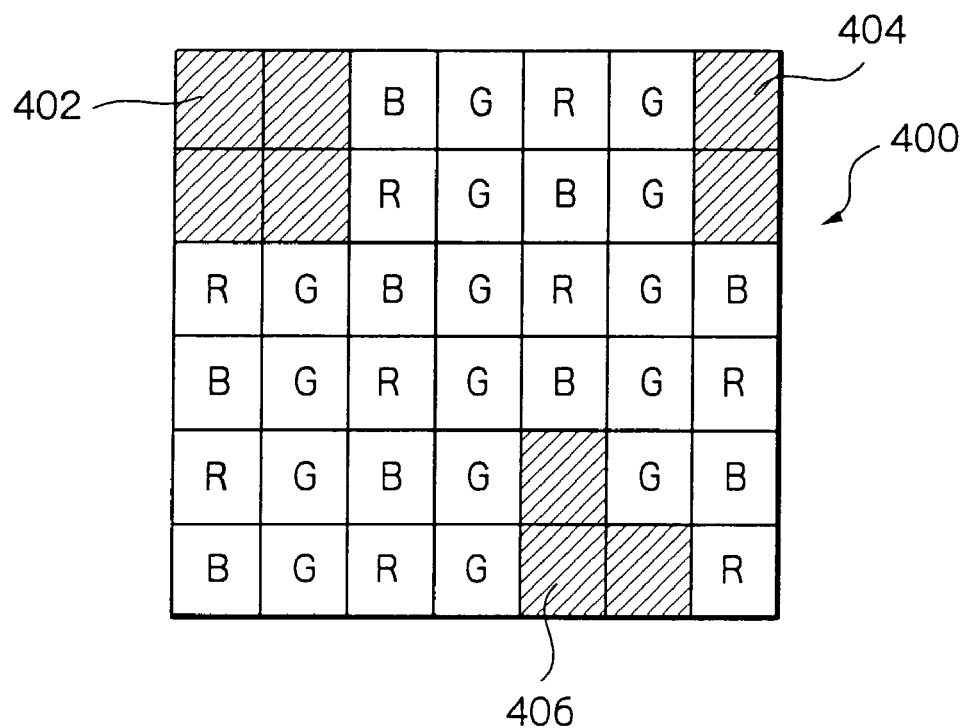
FIG. 4 is a view showing part of a specific color filter pattern arranged on the image sensor.
FIG. 5 shows a specific arrangement of control cells forming part of the color filter pattern of FIG. 4.

FIG. 4 shows a specific arrangement of the color filter segments 214 associated with the usual pixel cells as distinguished from control cells. As shown, R, G and B color filter segments 214 are arranged in a vertical G stripe, RG checker pattern 400. As indicated with hatching in FIG. 5, one or more of the pixel cells are implemented as control cells 402, 404 and 406 that do not have color filters, as will be described more specifically later. The filter pattern shown in FIG. 4 is, of course, only illustrative and may be replaced with a Bayer or similar conventional filter pattern.

In the configuration shown in FIG. 2, light incident to the microlens 218 is transmitted through the color filter 214 to reach the photodiode 204. The photodiode 204 transforms the incident light to a corresponding signal charge. The signal charge is sequentially transferred along the vertical transfer path 208 and horizontal transfer path. The previously mentioned output amplifier outputs the signal charge in the form of a pixel signal indicative of a pixel value corresponding to the signal charge. Likewise, the photodiode 204 assigned to the control cell transforms light incident thereto via the microlens 218 to a corresponding signal charge. This signal charge is also routed through the vertical transfer path 208 and horizontal transfer path to the output amplifier.

As stated above, the solid-state image sensor 12 of the illustrative embodiment includes an RGB color filter layer having filter segments partly forming the control cells. A timing controller 14 shown in FIG. 1 drives the image sensor 12 with a drive signal. The image sensor 12 produces on its output 102 signals including the output values of the pixel cells, the output values of the control cells, and the output value of an optical black portion not shown. The filter pattern of the illustrative embodiment differs from the conventional filter pattern in that the former includes the control cells, i.e. photosensitive cells where the color filter segments are absent.

The control cells are arranged at preselected positions of the image sensor 12 in the same plane as the usual pixel cells. The control cells each are a photosensitive cell where the color filter segment 214 is absent above the photodiode 204, so that light transmitted through the microlens 218 is directly incident to the control cell via the colorless, transparent overcoat layer 216. The control cells play the role of a sensor responsive to the quantity of incident light and used to effect automatic or manual focusing, telemetry, exposure control and other image-shooting adjustments in, e.g. a low luminance environment. As shown in FIG. 1, the camera 10 includes a digital signal processor 20. The digital signal processor 20 is so configured as not to use the outputs of the image sensor 12 derived from the signal charges output from the photodiodes 204, which constitute the control cells, as pixel signals that form a still picture.

FIG. 3 shows one of the control cells in a perspective view. As shown, the control cell differs from the pixel cell, FIG. 2, in that the color filter 214 produced by, e.g. photoresist processing is absent, and in that an overcoat is filled in the portion corresponding to the color filter 214 by spin coating or similar technology. As for the rest of the configuration, the control cell may be identical with the pixel cell. The microlens 218 is positioned on the overcoat layer 216. The control cells may be arranged in any one of various patterns that will be described later specifically.

With the above-described structure, each control cell has a broader spectral characteristic and therefore higher transmittance than the pixel cells in the range of visible rays because the color filter segment 214 is absent. This increases the quantity of light to be incident to the control cells and provides the control cells with a higher photoelectric conversion efficiency, i.e. higher sensitivity than the pixel cells. Each photodiode 204 constituting one control cell transforms light incident thereto to a signal charge without the intermediary of the color filter 214. Therefore, the control cells output greater values than the pixel cells for a given quantity of incident light. More specifically, assume that the camera 10 picks up, in a low illumination environment, a scene including a subject implemented as an even surface of the same illumination. Then, the control cells can output greater values than the pixel cells.

Specific arrangements of the control cells will be described hereinafter. For example, in the G stripe, RB checker filter pattern shown in FIG. 5, a control cell 402 is positioned at the top left corner of the pattern. Three other control cells are respectively positioned at the right, beneath and diagonally below the control cell 402. The control cell 404 is positioned at the right corner of the pattern while another control cell is positioned beneath the control cell 404. Further, the control cell 406 is positioned at the bottom of the pattern while to other control cells are respectively positioned above and at the right of the control cell 406.

Figure 6:
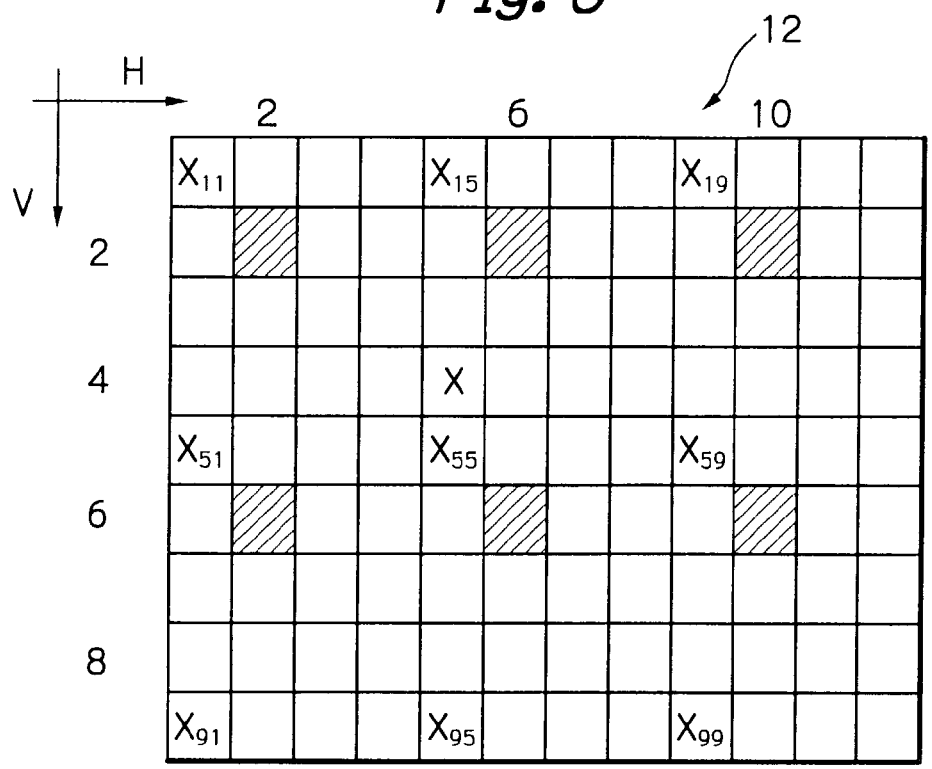
FIGS. 6 and 7 each show another specific arrangement of the control cells.
Figure 7:
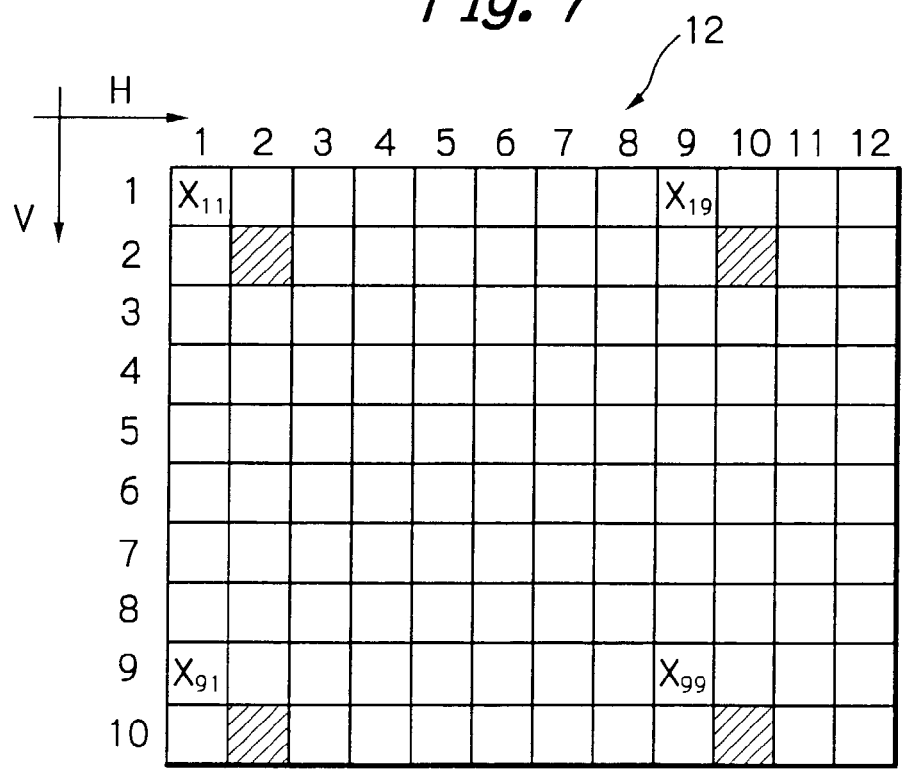

FIG. 6 shows another specific arrangement of the control cells. As shown, nearby control cells, indicated by hatching, are spaced from each other by a plurality of pixels. More specifically, every fourth cell in the vertical and horizontal directions is implemented as a control cell. In the event of image-shooting adjustment, by driving the image sensor 12 in a one-to-four pixel skipping mode, it is possible to read out mainly the output values of the control cells in the vertical or horizontal direction. FIG. 7 shows another specific arrangement in which every eighth cell in the vertical and horizontal directions is implemented as a control cell. To read out the output values of the control cells shown in FIG. 7, the image sensor 12 is driven in a one-to-eight pixel skipping mode. In the movie mode, the image sensor 12 is driven in a pixel skipping mode by skipping the control cells line by line.

Figure 8:
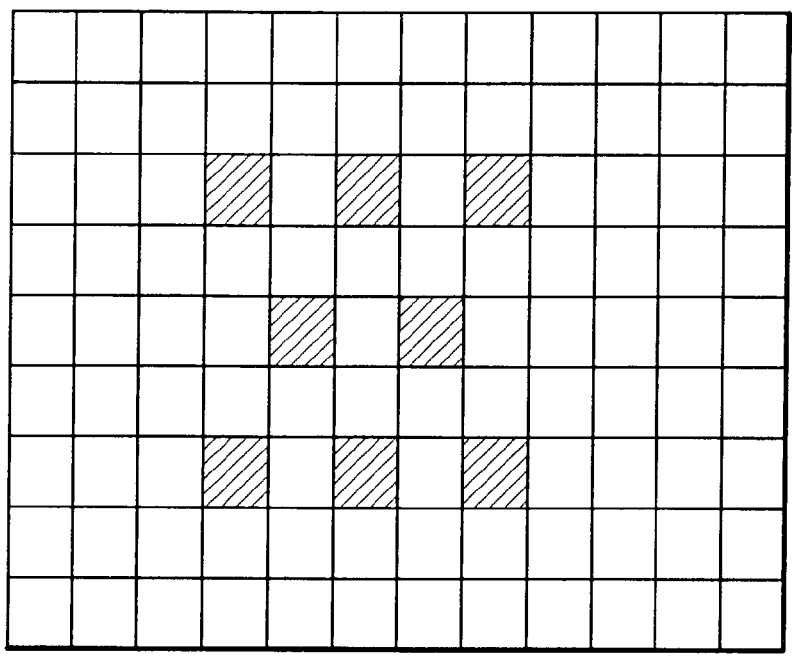
FIG. 8 shows the control cells concentrating on the center portion of the array of photosensitive cells of the image sensor.

FIG. 8 is an enlarged view showing the center portion of the array of photosensitive cells of the image sensor 12 representative of still another specific arrangement of the control cells. As shown, the control cells, indicated by hatching, are positioned in the central portion of the array of photosensitive cells of the image sensor 12. If desired, additional control cells fewer in density per unit area than the central control cells may be arranged in the vicinity of the edges of the array of photosensitive cells. This kind of arrangement will weight the output values of the control cells at the center portion of the entire frame.

Figure 9:
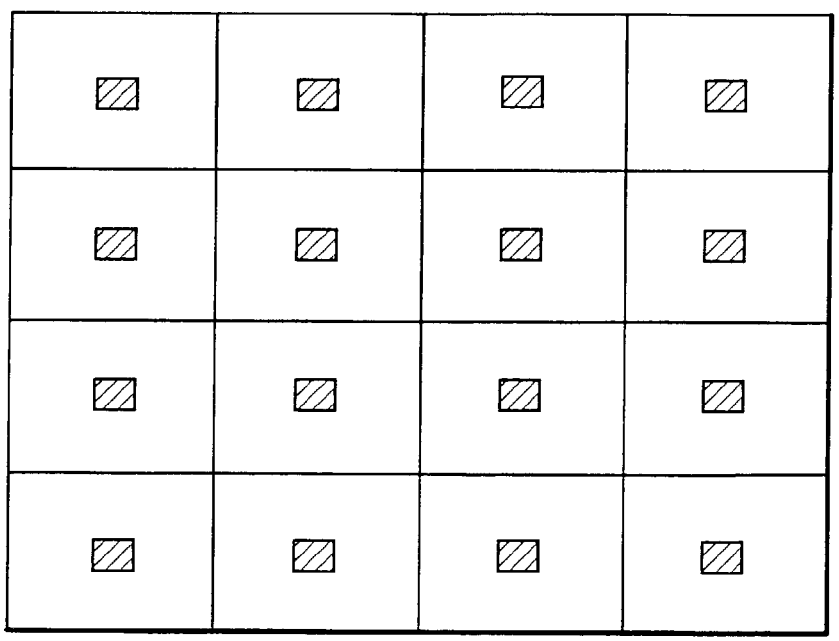
FIG. 9 shows a specific arrangement of the control cells in the blocks into which the array of photosensitive cells is divided.

FIG. 9 shows the entire, effective pixel area of the image sensor 12. As shown, the effective pixel area is divided into sixteen blocks by way of example. A single control cell, indicated by hatching, is positioned at the center of each block. It should be noted that FIG. 9 shows the control cells emphasized in size relative to the entire frame size for clarity. Alternatively, a plurality of control cells may be arranged in each block, e.g. at the four corners or the center portion of each block. In any case, when the blocks constituting the effective pixel area are selectively used, the output value of the control cell in each block is representative of the entire block. A greater number of control cells may be positioned in the blocks around the center than in the other blocks, if desired.

Figure 10:
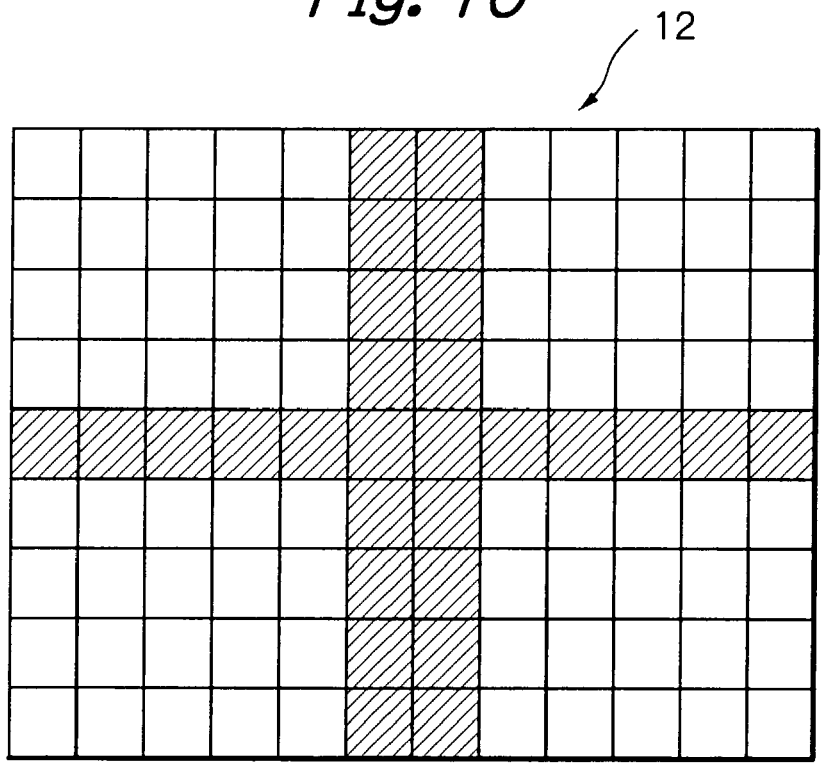
FIGS. 10 and 11 each show another specific arrangement of the control cells in the center portion of the array of photosensitive cells of the image sensor.
Figure 11:
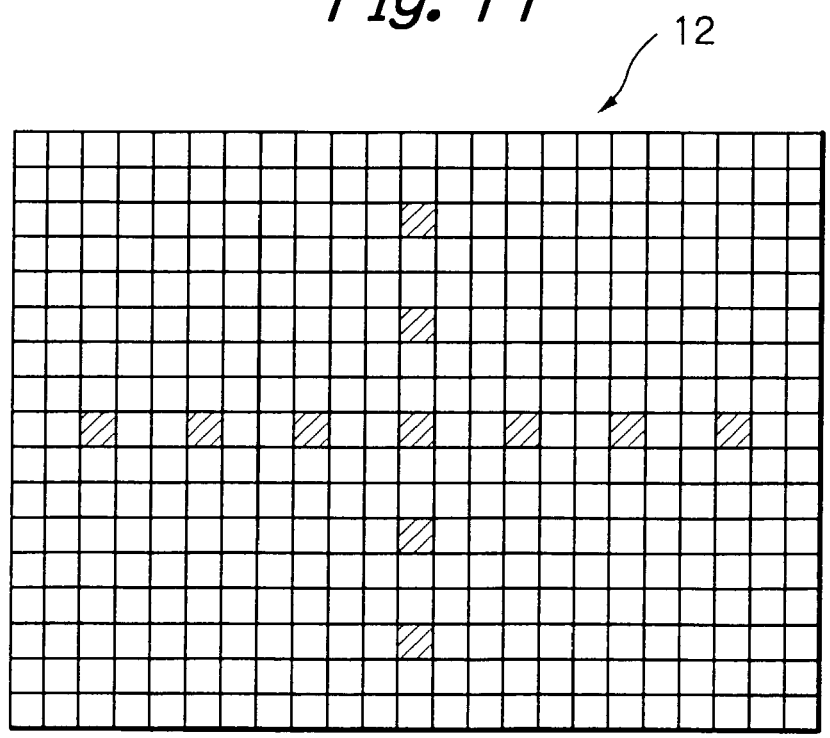

FIG. 10 is an enlarged view showing the center portion of the array of photosensitive cells of the image sensor 12 representative of a further specific arrangement of the control cells. As shown, the control cells are arranged in a single horizontal array and two vertical arrays crossing each other. As shown in FIG. 11, nearby control cells in each of such arrays may be spaced from each other by a preselected number of pixel cells, if desired.

Figure 12:
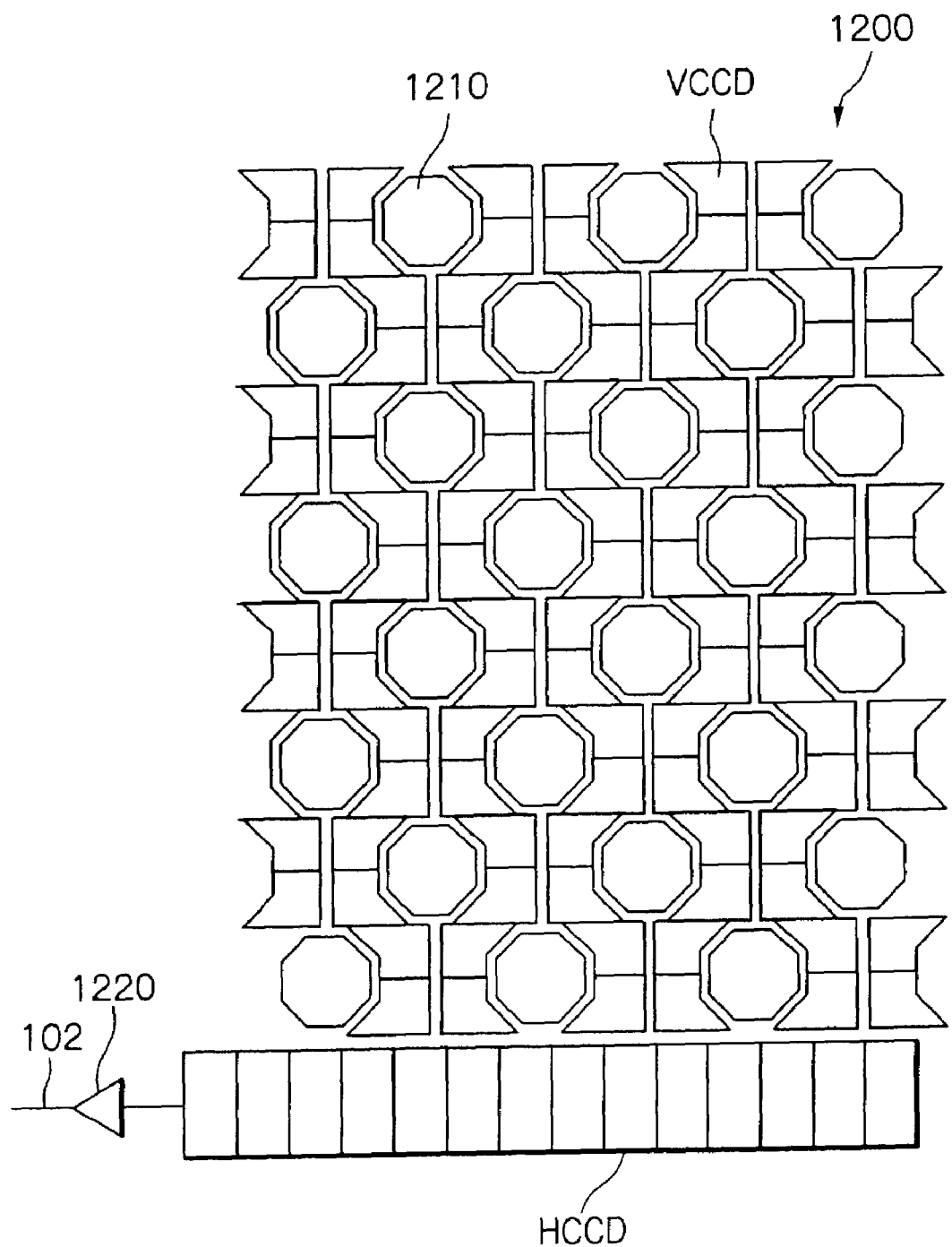
FIG. 12 is a plan view showing a specific honeycomb pattern of photosensitive cell array applicable to the image sensor.

The foregoing description has concentrated on the rectangular pixel pattern of the image sensor 12 including the control cells. FIG. 12 shows a honeycomb pixel pattern also applicable to the illustrative embodiment. As shown, a solid-state image sensor 1200 has the photosensitive arrays of the pixel cells and those of the control cells arranged in a honeycomb pattern. The photosensitive arrays each being, e.g. hexagonal, octagonal or nearly circular are arranged on the photosensitive cell array of the image sensor 1200 zigzag in, e.g. the vertical direction. The honeycomb pattern efficiently increases the total effective area of the photosensitive arrays and resolution in both of the vertical and horizontal directions.

More specifically, in the honeycomb type of image sensor 1200, photosensitive cells 1210 forming the openings of photodiodes (PD) are arranged in a lattice pattern. The photosensitive cells 1210 diagonally adjoining each other are spaced by a distance smaller than the distance between the cells adjoining each other in the vertical or horizontal direction. VCCDs (vertical transfer CCDs) form vertical transfer paths each extending zigzag in the vicinity of a particular vertical array of the photosensitive cells 1210. HCCDs (horizontal transfer CCDs) form a horizontal transfer path for transferring signal charges delivered via the vertical transfer paths to an output amplifier 1220. The output amplifier 1220 converts the signal charges to electric signals and produces the electric signals on its output 102.

Figure 13:
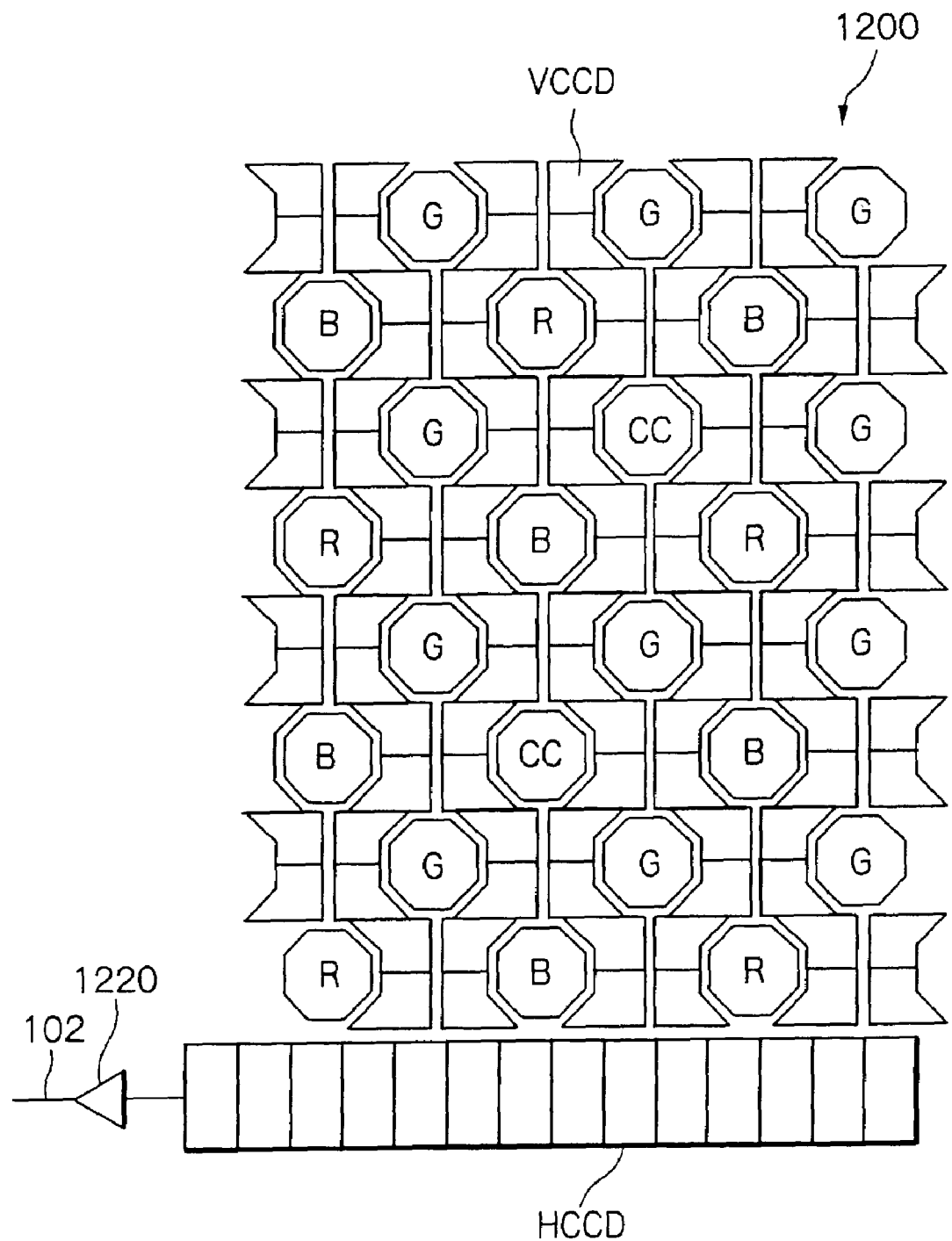
FIG. 13 shows a specific arrangement of the controls cells in the honeycomb pattern.

FIG. 13 shows a specific G stripe, RB checker filter pattern applied to the honeycomb type image sensor 1200. In this filter pattern, pixels at preselected positions are implemented as blank pixels, i.e. control pixels (CC). Of course, any one of the various control cell arrangements described with reference to FIGS. 6 through 11 may be applied to the image sensor 1200.

As stated above, various control cell patterns are available with the illustrative embodiment and selectively used in matching relation to the purpose of image-shooting adjustment. For example, assume that the illustrative embodiment determines pixel values corresponding to cell positions where the control cells are located by processing the output signal of the image sensor. Then, the illustrative embodiment performs calculation with pixel values around each control cells. In this case, the control cells should be positioned such that their pixel values can be produced by the interpolation, particularly defective image correction, of the pixel-by-pixel output signal of the image sensor. In any case, the control cells are located at particular positions in the array of photosensitive cells that can give information necessary for desired pickup control and can be effectively corrected by postprocessing.

The number of the control cells is suitably selected in matching relation to required image quality and the number of defective pixels, which are included in the image sensor and will be described specifically later. Also, the number of the control cells to be used is dependent on accuracy required of image-shooting control as well as the contents of image-shooting control. The illustrative embodiment is practicable even with a single control cell located at any desired position, e.g. the center of the array of photosensitive cells; the output of the single cell can derive information representative of the quantity of incident light.

As for a control cell pattern for implementing contrast sensing type of AF control, a plurality of control cells are arranged on each line or in a plane that satisfies a plurality of sampling points in the array of photosensitive cells in the vertical and horizontal scanning directions as well as in the diagonal direction. In this case, the illustrative embodiment picks up high-frequency components out of the output values of the control cells in the focusing area and adds them up to produce an estimated contract value. The illustrative embodiment then selects a lens position corresponding to peak one of the estimated contrast values at the various positions of the lens 8 to thereby control the focus position of the lens 8.

The colorless, transparent overcoat layer filling the space around each control cell may be replaced with any other suitable light transmitting member. For example, use may be made of a transparent member exhibiting the same spectral transmission characteristic for all wavelengths, so long as it has higher transmittance than the color filter segments. Further, such a transparent member may be replaced with a gap formed above the photosensitive portion and not filled with the light transmitting member, in which case light output from the microlens 218 will be incident to the photodiode 204 via the gap.

In general, the solid-state image sensors may unavoidably include, for production reasons, defective photosensitive cells that cannot generate output signals corresponding to the quantities of incident light and lying in an allowable range. It is extremely difficult to fully obviate defective cells from the cost standpoint as well. In light of this, it has been customary to correct the output value of a defective pixel by using, e.g. the output values of the other pixels, as may be referred to as defective pixel correction. To select acceptable solid-state image sensor devices in accordance with the illustrative embodiment on the production line, the numbers of the defective cells and the actually arranged control cells of each image sensor are added to each other to determine that image sensor acceptable if the resulting sum is smaller than a predetermined threshold.

More specifically, in order to form a picture from the image signals output from the image sensor 12, e.g. to shoot a scene to form a still picture or to produce an output picture having the entire pixels in the imaging area, the digital signal processor 20, FIG. 1, configured to process the output signals of the image sensor 12 handles the control cells as defective cells and does not use their output values for image formation. Instead, the digital signal processor 20 interpolates the output values of the control cells with those of the other cells for thereby correcting the pixel values at the control cells as if the latter were defective cells, as will be described more specifically later.

Further, in the low illumination mode where the digital signal processor 20 produces cell signals for image-shooting control from the output signal of the image sensor 12, if any one of the control cells is actually defective, then the digital signal processor 20 excludes the output value of the defective control cell from image-shooting adjustment and uses the output values of the other or normal control cells to calculate estimated values for imaging control.

Referring again to FIG. 1, the timing controller 14 is adapted to deliver drive signals 100 to the image sensor 12. In addition, the timing controller 14 is also adapted to drive various sections of the camera 10 in accordance with control signals fed from a main controller 22, which includes a CPU (Central Processing Unit). More specifically, the main controller 22 feeds the timing controller 14 with a control signal 130 indicative of an exposure start timing. In response, the timing controller 14 delivers various drive signals to the image sensor 12 from its output 100, causing the image sensor 12 to shoot a scene at the above timing with a preselected exposure vale. The drive signals include charge transfer pulses, field shift pulses, and read-out pulses. Further, in response to a control signal fed from the main controller 22, the timing controller 14 generates a pixel clock 104 for driving the image sensor 12, an analog processor 16, an AD (Analog-to-Digital) converter 18, and the digital signal processor 20. In addition, the timing controller 14 outputs other timing signals 108 including color separation pulses, an AD clock, and synchronizing signals.

When the main controller 22 delivers a control signal indicative of the movie mode to the timing controller 14, the timing controller 14 outputs drive signals 100 that cause the image sensor 12 to perform partial reading, e.g. to read the pixel cells of the photosensitive cell array in the pixel skipping mode. In response, the image sensor 12 outputs the resulting pixel signals at a high rate. For example, the image sensor 12 outputs a pixel signal for continuously displaying fifteen to thirty frames per minute. In the illustrative embodiment, in the movie mode, the drive signals 100 drive the image sensor 12 while preventing it from developing signals from the control cells.

When the control signal fed from the main controller 22 to the timing controller 14 is indicative of the camera mode, the timing controller 14 outputs drive signals 100 that cause the image sensor 12 to develop cell signals from all of the pixel cells and control cells existing in the array of photosensitive cells. Consequently, the image signals 102 output from the image sensor 12 in the camera mode include the cell signals generated by the control cells.

When the main controller 22 delivers a control signal indicative of image-shooting adjustment to the timing controller 14 and sets up the low illumination mode, the timing controller 14 delivers to the image sensor 12 drive signals 100 for causing the latter to mainly produce signal charges generated by the control cells. For example, as for the specific arrangement of control cells shown in FIG. 6, the control signals 100 cause the image sensor 12 to produce the pixel signals in the one-to-four pixel skipping mode, i. e. to read every fourth cell in the array. Likewise, as for the specific control cell arrangement shown in FIG. 7, the control signals 100 cause the image sensor 12 to develop the pixel signals in the one-to-eight pixel skipping mode, i.e. to read every eighth cell. Further, as for the other specific control cell arrangements shown in FIGS. 8 through 10, the control signals 100 cause the image sensor 12 to mainly read the cells on horizontal scanning lines that include the control cells.

When the main controller 22 selects a normal illumination mode, as distinguished from the low illumination mode, the timing controller 14, when received an image-shooting adjustment command, generates drive signals 100 identical with those assigned to the movie mode. In this case, image-shooting adjustment is effected in accordance with various estimated values derived from the output values of the R, G and B pixel cells and including estimated luminance and contrast values.

The analog processor 16 is connected to the output 102 of the image sensor 12 and includes a CDS (Correlated Double Sampling) circuit not shown specifically. The CDS circuit executes a correlated double sampling with the analog image signal output from the image sensor 12 in synchronism with the pixel clock 104, which is fed from the timing controller 14. This successfully cancels reset noise particular to the signals output from the individual cells.

The CDS circuit has its output connected to a color separation circuit, not shown. The RGB image signal 102 output from the image sensor 12 is dot-sequentially input to the color separation circuit. The color separation circuit separates the color components R, G and B from each other in response to the color separation pulses fed from the timing controller 14. The analog processor 16 additionally includes a variable-gain amplifier, a gamma correction circuit, and a multiplexer, although not shown. The variable-gain amplifier and gamma correction circuit cooperate to adjust the levels of the color component signals separated from each other. The multiplexer multiplexes the adjusted color component signals. In the normal illumination mode, these circuits execute such analog signal processing in response to the pixel clock 104 and timing signal 106. The analog processor 16 has its output 106 connected to the AD converter 18.

On the other hand, when the main controller 22 selects the low illumination mode, the analog processor 16 does not execute the above-described level adjustment nor the correction with the cell signals output from the control cells and included in the output signal of the CDS circuit. As a result, the output values of the color separation circuit are directly fed to the AD converter 18.

The AD converter 18 converts the analog signals applied to its input 106 to digital signals each having a preselected number of bits. More specifically, the color component signals are sequentially input to the AD converter 18 while being switched every horizontal scanning period. The timing controller 14 feeds the timing signals 108 including the AD clock and synchronizing signals, as stated earlier. In the illustrative embodiment, the AD converter 18 sequentially converts the pixel signals and cell signals output from the control cells, which are included in the color component signals, to, e.g. eight-bit or twelve-bit digital values in response to the above timing signals 108. The digital values or image data thus appear on the output 110 of the AD converter 18 connected to the digital signal processor 20.

The digital signal processor 20 executes various kinds of digital signal processing with the input image data in accordance a control signal 112 fed from the main controller 22. Specifically, the digital signal processor 20 includes a frame memory (FM) 21 for temporarily storing the image data. In the camera mode, the digital signal processor 20 stores the image data in the frame memory 21 and then corrects the color balance, luminance, chroma and so forth of the stored image data in accordance with signal processing parameters. Also, the digital signal processor 20 executes filtering, contour or edge enhancement and other digital signal processing to thereby produce an adequate still picture.

Further, the digital signal processor 20 transforms the R, G and B color image data to luminance data Y and color difference data C. When a movie is to be displayed on an outside, general-purpose display in the movie mode, the digital signal processor 20 delivers the data Y and C to the output section 24 from its output 116. In the camera mode, the digital signal processor 20 transforms the image data Y and C in conformity to a compression coding system assigned to the output section 24. In the movie mode, the digital signal processor 20 delivers the R, G and B color image data to the output section 24, so that a liquid crystal display monitor, not shown, included in the output section 24 can display a movie.

The digital signal processor 20 is adapted to convert the pixel signals generated with the specific filter pattern of the image sensor 12 to the primary colors R, G and B at the respective pixel positions. In the camera mode, the signal processor 20 produces the R, G or B pixel value at the position of each cell, which is a pixel cell or a control cell, by interpolation with the data of pixel cells surrounding that pixel. More specifically, if the cell to be dealt with is an R, G or B pixel cell, then the signal processor 20 executes interpolation by using the value of the pixel cell and surrounding pixels. Conversely, if the cell of interest is a control cell, then the signal processor 20 uses only pixels surrounding the control cell. In an application in which the photodiodes are arranged in the honeycomb pattern stated earlier, the signal processor 20 should preferably be configured to position a virtual pixel where an actual cell is absent between nearby pixel cells, and calculate a pixel value at the virtual pixel.

Furthermore, when the controller 22 sets up the image-shooting adjustment mode, the digital signal processor 20 calculates estimated values for various image-shooting adjustments in accordance with the output signals of the image sensor 12. The estimated values include an estimated luminance value for AE control and an estimated contrast value for AF control. More specifically, in the image-shooting adjustment mode, the signal processor 20 performs photometry for measuring the luminance level of the scene on the basis of the digital image signal 110. At this instant, the controller 22 feeds the signal processor 20 with the current F number, shutter speed and sensitivity, which determine an exposure control value. In this case, the array of photosensitive cells is divided into a plurality of blocks, and the signal processor 20 accumulates the signal levels within each block. The signal processor 20 then weights the resulting sum of a particular block, e.g. the center block in accordance with position-in-area information, thereby producing an estimated luminance value.

Just after having turned on the power switch of the camera, the controller 22 sets up the movie mode and measures the luminance level of the scene in accordance with the R, G and B pixel signals representative of the scene. The controller 22 then compares an estimated luminance value derived from the R, G and B pixel signals and output from the digital signal processor 20 with a preselected threshold value, thereby determining whether or not the estimated luminance value is greater than the threshold value. If the estimated luminance value is smaller than the threshold value, then the controller 22 determines that the luminance of the scene being picked up is low, and sets up the low illumination mode. Conversely, if the estimated value is equal to or greater than the threshold value, then the controller 22 again sets up the normal illumination mode. The controller 22 sends out a signal indicative of the low illumination mode or the normal illumination mode to the various sections of the camera 10.

In the low illumination mode, the digital signal processor 20 separates cell signals included in the image signal 110 and derived from the control cells and calculates an estimated luminance value with each cell signal. More specifically, in the low illumination mode, the signal processor 20 uses only the cell signals or both the cell signals and other R, G and B pixel signals, based on the arrangement of the control cells, to estimate the luminance level of the scene. The signal processor 20 reports the estimated luminance value to the controller 22. It is to be noted that in the normal illumination mode the signal processor 20 uses the R, G and B pixel signals to produce the various estimated values.

In the event of AF control, while the lens 8 is sequentially shifted to a plurality of positions, the digital signal processor 20 separates the contrast component from pixel signals or cell signals of the scene obtained at the different lens positions. The signal processor 20 then calculates an estimated contrast value representative of the maximum contrast component obtained in a certain range-finding condition. More specifically, in the low illumination mode, the signal processor 20 produces an estimated contrast value on the basis of the levels of the cell signals 110. On the other hand, in the normal illumination mode, the signal processor 20 produces an estimated contrast value in accordance with the R, G and B pixel signals 110.

Before generating pixels in the camera mode, as stated earlier, the digital signal processor 20 corrects values output from defective cells and control cells in the image sensor 12, as will be described hereinafter. The signal processor 20, when correcting the pixel data of a pixel in question, which may be a defective or control cell, uses one or more pixels around that pixel, to correct the output value of that cell, thereby generating a still picture free from defects.

More specifically, the controller 22 delivers position information 114 to the digital signal processor 20. The signal processor 20 executes interpolation for replacing the value of a defective pixel cell or a control cell with the values of surrounding pixels of the same color as that cell. As for a control cell, the signal processor 20 assigns to the position of the control cell the color component of a filter segment corresponding to the above-mentioned position. The signal processor 20 then calculates a pixel value for the control cell position by using adjoining pixel values of the same color as the assigned color. For example, the signal processor 20 calculates the mean value of, among pixel data written to the frame memory 21, the pixel data above, below, rightward and leftward of the pixel data of interest and identical in color with the pixel of interest. The signal processor 20 writes in the mean value into an address location of the frame memory 21 associated with the pixel of interest.

As shown in FIG. 1, the embodiment includes a coordinates memory 28 adapted for storing defective image information and control cell information. FIG. 14 shows a specific format in which the coordinates memory 28 lists address information and cell attribute information. The address information is representative of the coordinates positions (H, V) of the cells arranged in the array of photosensitive cells of the image sensor 12. The cell attribute information is representative of the attributes of the cells located at the coordinates positions (H, V). The cell attribute information includes the defective image information on whether or not pixel cells are defective, and control cell information on whether or not cells are control cells. As for cells other than those cells mentioned above, i.e. normally operable R, G and B pixel cells that need no correction, the coordinates memory 28 does not store address information nor cell attribute information.

Assume that the image sensor 12 has the control cells arranged in the pattern shown in FIG. 6 by way of example. Then, the coordinates memory 28 stores address information representative of the coordinates (H, V) of the control cells that are (2, 2), (2, 6), (2, 10), (6, 2), (6, 6) and (6, 10), with the left topmost cell allotted to the origin (0, 0). As shown in FIG. 14, the control cell information stored in the coordinates memory 28 contains cell attribute information taking logical ONEs associated with those control cells. If the pixel cell represented by the coordinates (4, 5), for example, is a defective cell, then the defective cell information corresponding to the pixel cell (4, 5) is a ONE and stored in the coordinates memory 28 together with the coordinates thereof. Further, if the control cell positioned at the coordinates (6, 10), for example, is a defective cell, then the defective cell information corresponding to the control cell (6, 10) is a ONE and stored in the coordinates memory 28 together with the coordinates thereof. It is to be noted that logical ZEROs included in the cell attribute information are representative of cells other than defective cells and control cells.

A manufacturer producing the image sensor 12 is expected to record the cell information shown in FIG. 14 in a recording medium and provides it together with the image sensor 12. When the image sensor 12 is to be built in an image pickup apparatus, the cell information stored in the recording medium is written in into the coordinates memory 28 in the format shown in FIG. 14. FIG. 15 shows an alternative format in which the cell information may be stored in the coordinates memory 28. As shown, the defective cell information and control cell information are separate from each other, and each is stored in a particular area of the coordinates memory 28. The illustrative embodiment causes the main controller 22 to recognize the type of color filter pattern of the image sensor 12, as stated earlier. Alternatively, information representative of the type of color filter pattern may also be stored in the coordinates memory 28, so that the main controller 22 can recognize the pattern type.

The control cell information representative of the coordinates of the control cells is stored in the coordinates memory 28, as stated above. The digital signal processor 20 can therefore execute, in the camera mode, the same correction processing with signals derived from the control cells as with defective pixel cells. This is also true when the control cells themselves happen to be defective.

If any one of the control cells is defective, and the coordinate data of the defective control cell are registered at the coordinates memory 28, then the main controller 22 identifies the defective control cell and inhibits the digital signal processor 20 from using the output value of the control cell for image-pickup control. In this case, the digital signal processor 20 uses signals output from the control cells other than the actually defective control cell to estimate the luminance level and high-frequency component of the defective control cell. The processor 20 then sends out the estimated values to the main controller 22.

In the camera mode, after the pixel correction described above, the digital signal processor 20 generates pixels, adjusts color balance, corrects luminance and chroma, and executes YC conversion. The processor 20 then reads out the corrected and adjusted image data from the frame memory 21 while delivering them to the output section 24 from its output 116.

The output section 24 transforms the format of the image data output from the digital signal processor 20 to a desired format. More specifically, the output section 24 includes a video monitor for displaying a picture or a movie represented by the image data. In the movie mode, the output section 24 causes the monitor to display consecutive frames of pictures in accordance with the input R, G, and B image data. On the other hand, in an application in which a television monitor, video printer, video recorder or similar general-purpose video equipment is detachably connected to the output 118 of the output section 24, the output section 24 transforms the image data 116 to an NTSC (National Television System Committee) signal and delivers the NTSC signal to the video equipment.

Further, the output section 24 is capable of compressing the YC image data representative of a still picture under the JPEG (Joint Photographic coding Experts Group) system, thereby producing pieces of data each having a specified length. The data are written into a memory card or similar recording medium 30 removably connected to the output 120. Also, the output section 24 is capable of reading out image data from the recording medium 30, decoding the image data, and then feeding the decoded image data to the digital signal processor 20. The digital signal processor 20 again transforms the format of the image data to a format matching with a destination and feeds the transformed image data to the output section 24.

The digital signal processor 20 may include a digital terminal for inputting and outputting a digital image signal. For example, in an application where the digital terminal is a serial or parallel input/output terminal for inputting and outputting movie data representative of consecutive frames, the processor 20 should preferably transform the format to a format matching with equipment connected to the output section 24 and deliver the resulting data from the input/output terminal.

The main controller 22 sets the movie mode or the camera mode in the sections contained in the camera 10 in accordance with the operator's manipulation on the control pane 126. Also, the main controller 22 selects the image-shooting adjustment mode in accordance with the image signal output from the image sensor 12 for thereby effecting image-shooting adjustment, which includes the adjustment of exposure and focus. Further, in the image-shooting adjustment mode, the main controller 22 determines luminance on the basis of luminance information fed from the digital signal processor 20 and then selects the low illumination mode or the normal illumination mode.

More specifically, in the initial state just after the turn-on of the power switch of the camera 10, the main controller 22 generates a control signal indicative of, e.g. the movie mode in accordance with parameters set beforehand and feeds the control signal to the various sections of the camera. In response to a shutter release signal output from the control panel 26 and representative of the operation of the shutter release button, the main controller 22 delivers a control signal indicative of the camera mode to the various sections. At this instant, based on the estimated luminance and contrast values fed from the digital signal processor 20, the main controller 22 determines a shutter speed, an F number and a focal point for a still picture. The controller 22 delivers control signals representative of those factors determined to the timing controller 14.

When the shutter release button is implemented as a two-stroke switch, the main controller 22 should preferably have the following configuration. When the shutter release button is depressed into its first stroke to a half-depth position, the main controller 22 selects the image-shooting adjustment mode in response to a first release signal representative thereof. When the shutter release button is depressed into its second stroke to a full-depth position, the main controller 22 selects the camera mode in response to a second release signal representative thereof.

On receiving the control signals 130 indicative of control over the release timing and exposure from the main controller 22, the timing controller 14 drives the image sensor 12 and analog processor 16.

The main controller 22 reads out the cell information from the coordinates memory 28 to thereby recognize the information relating to the image sensor 12. The main controller 22 then converts the address included in the cell information to position information designating the address locations of the frame memory 21. The position information is fed to the digital signal processor 20 together with the cell attribute information.

In the camera mode in particular, the main controller 22 controls the digital signal processor 20 to execute pixel generation and pixel interpolation. More specifically, the main controller 22 delivers information relating to picture recording and selected on the control panel 26 to the digital signal processor 20 in the form of the control signals 112. The above-mentioned information includes parameters for white balance adjustment, a picture size, compression/non-compression, and a compression ratio.

Furthermore, the main controller 22 selects various systems for image-shooting adjustment and controls the digital signal processor 20 therewith. For example, the main controller 22 determines a photometry area and a range finding area for AE and AF controls in a view and determines a pattern to use for photometry and range finding. The main controller 22 then uses the cells that constitute the pattern thus selected to cause the digital signal processor 20 to generate the previously stated, estimated luminance value and estimated contrast value. A plurality of photometry areas and a plurality of range finding areas are available and can be selectively used in accordance with the operation of the control panel 26. The photometry area and range finding area do not have to be coincident with each other. In addition, the main controller 22 may use a particular pattern for each of the normal and low illumination modes, if desired.

Figure 16:
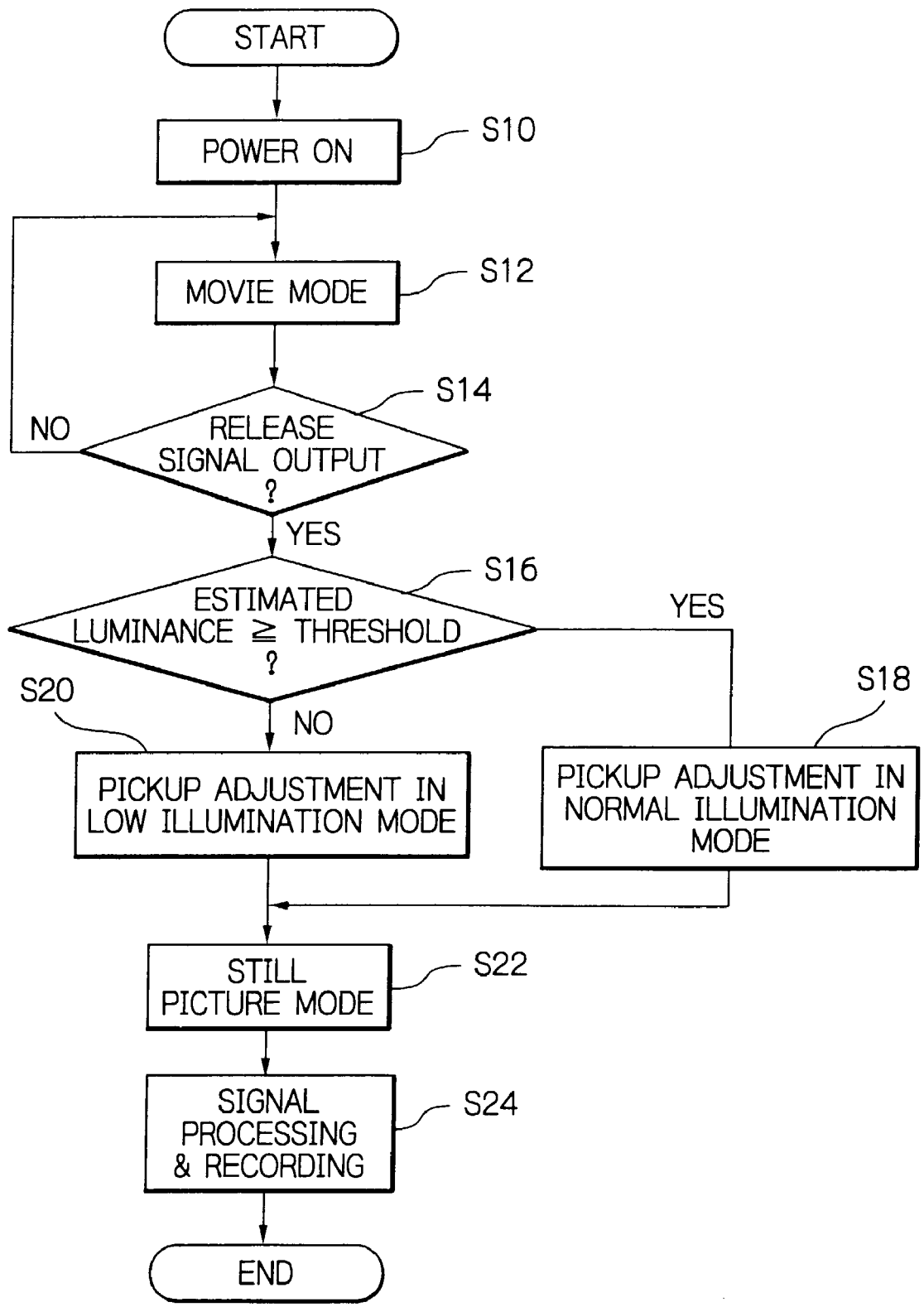
FIG. 16 is a flowchart useful for understanding a specific operation of the illustrative embodiment.

Reference will be made to FIG. 16 for describing a specific operation of the digital camera 10. As shown, when the operator turns on the power switch, the various sections of the camera 10 are rendered operative (step S10). In the step S10, the main controller 22 initially selects, among a image-pickup mode, a reproduction mode and a communication mode, the pickup mode by way of example in accordance with the setting of the control panel 26. The pickup mode allows the operator to select either one of automatic and manual adjustments of exposure, focus and so forth, as desired. The following description will concentrate on automatic adjustment.

In the image-pickup mode, the main controller 22 sets up the movie mode in accordance with the setting of the control panel 26 (step S12). In the movie mode, the timing controller 14 delivers to the image sensor 12 drive signals for driving the image sensor 12 in the pixel skipping mode. Assume that the drive signals are indicative of the one-to-eight pixel skipping mode relating to the pattern shown in FIG 7 by way of example. Then, R, G and B pixel signals are read out from every eighth cell of the image sensor 12 in the horizontal and vertical directions. In this case, cell signals are not read out from the positions where the control cells are arranged. The analog processor 16 executes correlated double sampling with the R, G and B pixel signals, amplifies the pixel signals subjected to the correlated double sampling, and digitizes the amplified pixel signals. The resulting digital R, G and B pixel signals are input to the digital signal processor 20.

The digital signal processor 20 in turn converts the R, G and B pixel signals to NTSC format video signals for monitor display frame by frame while delivering the NTSC video signals to the output 118 via the output section 24. At the same time, the digital signal processor 20 calculates estimated luminance and contrast values every preselected period on the basis of the R, G and B pixel signals while feeding them to the main controller 20. The main controller 22 determines a charge storing time, which is a frame-by-frame exposing time (shutter speed), an F number and so forth in accordance with the thus estimated values and feeds them to the timing controller 14. Further, the main controller 22 controls a gain assigned to the analog processor 16 for level adjustment. In this manner, when the camera 10 is shooting a desired scene in the form of a movie, it displays the movie on the monitor while executing pickup control in accordance with the varying environmental conditions including lightness.

After the step S12, the main controller 22 determines whether or not a shutter release signal representative of the operation of the shutter release button is output (step S14). If the answer of the step S14 is positive (YES), then the main controller 22 executes a step S16; otherwise (NO, step S14), the main controller 22 returns to the step S12 for continuing the processing in the movie mode.

In the step S16, the illumination of the scene is determined. More specifically, the digital signal processor 20 produces an estimated luminance value by using the R, G and B pixel signals input thereto. The main controller 22 compares the estimated luminance value with a threshold luminance value. If the estimated luminance value is equal to or above the threshold value (YES, step S16), then the controller 22 determines that the illumination of the scene is normal (YES, step S16). If the estimated luminance value is below the threshold luminance value (NO, step S16), then the controller 22 determines that the illumination of the scene is low.

When the illumination is determined normal (YES, step S16), a step S18 is executed for executing image-shooting adjustment in the normal illumination mode. More specifically, the controller 22 causes the image sensor 12 to be driven in the same manner as in the movie mode. The resulting R, G and B pixel signals read out in the pixel skipping mode are output from the image sensor 12. The digital signal processor 20 calculates estimated luminance and contrast values on the basis of the R, G and B pixel signals and feeds them to the main controller 22. The main controller 22 determines an exposure value in accordance with the estimated luminance value (AE) and controls the focal position of the lens 8 (AF). The step S18 is followed by a step S22.

On the other hand, when the illumination is low (NO, step S16), processing for ending the movie mode, the steps of switching the method of driving the image sensor 12 and then reading mainly the control cells of the image sensor 12 are executed. More specifically, the digital signal processor 20 estimates luminance and contrast values on the basis of the cell signals read out of the control cells. Based on the thus estimated luminance and contrast values, the main controller 14 determines an exposure value for actual image-shooting in the camera mode to follow. The digital signal processor 20 may additionally use R, G and B pixel values read out together with the cell signals in calculating the estimated values, if necessary. In any case, in the low illumination mode, the control cells or high sensitivity pixels are sampled to produce estimated luminance and contrast values. Subsequently, an exposure time and an F number matching with the thus estimated values are determined for thereby controlling the focal position of the lens 8.

The step S18 or S20 is followed by a step S22 in which the scene is actually shot in the camera mode. More specifically, in the step S22, the camera 10 shoots the scene in accordance with the exposure information determined beforehand. In this case, all the photosensitive cells included in the image sensor 12 are read. Analog image signals readout from the image sensor 12 are sequentially subjected to various signal processing in the analog processor 16 and AD converter 18 and then input to the digital signal processor 20. The digital signal processor 20 writes in the input image data into its frame memory 21 for a moment.

In a step S24 following the step S22, the digital signal processor 20 receives from the main controller 22 the data of the pixel positions that correspond to the position information 114. The digital signal processor 20 then interpolates the above-mentioned data in the image data stored in the frame memory 21 to thereby correct the values of the defective pixel cells and those of the control cells. Further, a particular R, G or B pixel value is generated for each of the pixel positions of the corrected image data by interpolation. The resulting image data are subjected to adjustment as to color balance, luminance, chroma and so forth and further subjected to filtering, contour or edge enhancement and other digital signal processing. The image data so corrected and adjusted are read out from the frame memory 21 and input to the output section 24 in the form of YC image data. The output section 24 encodes the input YC image data by compression and records them in the recording medium 30.

As stated above, in the illustrative embodiment, signals for image-shooting adjustment are available with both of the R, G and B pixel cells and control cells included in the image sensor 12. For example, when the illumination of a scene to be pickup up is poor, not only R, G and B pixel values but also cell signals derived from the control cells can be used to accurately produce estimated values for exposure and focus control.

While the illustrative embodiment determines illumination in the step S16, FIG. 16, when a shutter release signal is output, it may be so modified as to intermittently determine illumination during movie mode operation, if desired. In such a modification, if the main controller 22 is adapted to determine that the illumination of the scene is low by way of example, then the main controller switches the control over the timing controller 14 and the drive of the image sensor 12 in such a manner as to read out mainly the values of the control cell even in the movie mode. The digital signal processor 20 uses the values read out of the control cells to calculate estimated luminance and contract values. Consequently, image-pickup control in the movie mode can be executed in accordance with the values of the control cells, thus increasing the accuracy of the pickup control.

In the illustrative embodiment, the quantity of light to be incident to a single photosensitive cell is increased to increase the amount of information conveyed by an image signal derived from a dark scene. Such an amount of information accurately derives control information for image-shooting control and therefore implements accurate control even in a dark scene or in the event of a shot at a high shutter speed. At the time of AE/AF control, information is mainly read out from the control cells with high sensitivity, which are located at preselected coordinates, for thereby enhancing accuracy. At the time of actual pickup in the camera mode, the control cells are dealt with as if they were defective pixels, which should not be used, in the same manner as defect correction, so that a high quality, still picture is achievable. In this manner, the image sensor 12 includes the photosensitive cells with higher sensitivity arranged therein than the photosensitive cells with color filter segments, insuring an amount of information great enough for imaging control without regard to the spectral sensitivity or the transmittance of color filter segments.

In summary, in accordance with the present invention, a digital camera includes a solid-state image sensor including photosensitive cells that are free from factors that would lower sensitivity. Therefore, even when a scene to be shot is short of illumination by way of example, the camera can attain estimated values for AE and AF control on the basis of the outputs of those particular cells at a sufficiently high level, thereby relatively reducing the influence of noise. This insures accurate image-shooting adjustment including AE and AF control. Signals output from the high sensitivity cells can be corrected by use of, e.g. a defect correcting function originally meant for still pictures.

The entire disclosure of Japanese patent application No. 2001-213040 filed on Jul. 13, 2001, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A solid-state image sensor supporting a low illumination mode and comprising a plurality of photoelectric conversion devices arranged in arrays for outputting color image signals representative of an optical image focused on said plurality of photoelectric conversion devices, said solid-state image sensor comprising:
    a plurality of first cells each being located at a particular pixel position where a color filter segment is absent between a light incidence side and one of said photoelectric conversion devices corresponding to the particular pixel position, each of said plurality of first cells outputting a particular signal charge corresponding to a quality of light incident without the intermediary of a color filter segment, said first cells providing a signal to a controller during said low illumination mode of said solid-state image sensor;
    a plurality of second cells located at pixel positions other than pixel positions where said plurality of first cells are located, each of said plurality of second cells outputting a particular second signal charge corresponding to a quantity of light incident via a color filter segment assigned to one of said plurality of photoelectric conversion devices that forms the second cell, said second cells providing a signal to said controller to determine whether to enter said low illumination mode;
    a charge transfer paths for sequentially transferring first signal charges and second signal charges in a vertical direction and a horizontal direction; and
    an outputting device for converting the first signal charges and the second signal charges transferred via said charge transfer paths to electric signals for said controller controlling said low illumination mode.

2. The image sensor in accordance with claim 1, wherein said first cells are arranged in a line.

3. The image sensor in accordance with in claim 1, wherein nearby ones of said first cells are spaced from each other by a distance corresponding to a number of pixels to be skipped in a pixel skipping mode.

4. The image sensor in accordance with claim 1, wherein a greater number of said first cells are arranged at a center portion than at peripheral portions of an array of photosensitive cells.

5. The image sensor in accordance with claim 1, wherein the signal charges of said first cells are read out from said image sensor at a time of image-shooting adjustment.

6. The image sensor in accordance with claim 1, wherein the second signal charges of said second cells are read out when said image sensor is driven in a movie mode.

7. The image sensor in accordance with claim 1, wherein the first signal charges and the second signal charges both are read out when said image sensor is driven in an whole-pixel read-out mode.

8. The image sensor in accordance with claim 1, wherein said first cells are so positioned as to be usable for both of AE (Automatic Exposure) control and AF (Automatic Focus) control.

9. The image sensor in accordance with claim 1, further comprising a storage storing position information relating to the pixel positions of said first cells and defective pixel information relating to positions of defective pixels.

10. The image sensor in accordance with claim 1, wherein color filter segments each being assigned to one of said second cells are primary-color filter segments.

11. The image sensor in accordance with claim 1, wherein color filter segments each being assigned to one of said second cells are complementary-color filter segments.

12. The image sensor in accordance wit claim 1, further comprising light-transmissive members each being positioned at the light incidence side of particular one of the first cells and having higher transmittance than the color filter segment.

13. A digital camera for receiving an optical image via a lens and generating image signals representative of the optical image, said digital camera comprising:
    an image sensor including a plurality of first cells, which are not provided with color filter segments at a light incidence side, and a plurality of second cells, which are provided with the color filter segments, each of said first and second cells outputting a particular signal corresponding to a quantity of incident light;
    a signal processing circuit for processing signals read out from said image sensor for thereby generating pixel values pixel by pixel and generating pixel signals representative of the optical image based on the pixel values; and
    a controller for selectively executing first image-pickup control for reading out first signals from said first cells or second image-pickup control for reading out signals from said second cells in a movie mode, said controller comprising a decision circuit for determining the quantity of light incident to said image sensor;
    said controller executing the first control when said decision circuit determines that the quantity of incident light is smaller than a preselected threshold value to thereby establish image-pickup control on a basis of the first signals.

14. The digital camera in accordance with claim 13, wherein said signal processing circuit comprises a circuit for producing an estimated value for executing exposure control, based on the first signals.

15. The digital camera in accordance with claim 13, wherein said signal processing circuit comprises a circuit for producing, based on the first signals, an estimated contrast value for controlling a focal position of the lens, and
    said controller controls the focal position of the lens in accordance with the estimated contrast value as the image-pickup control.

16. A digital camera for receiving an optical image via a lens and generating image signals representative of the optical image, said digital camera comprising:
    an image sensor including a plurality of first cells, which are not provided with color filter segments at a light incidence side, and a plurality of second cells, which are provided with the color filter segments, each of said first and second cells outputting a particular signal corresponding to a quantity of incident light;

a signal processing circuit for processing signals read out from said image sensor for thereby generating pixel values pixel by pixel and generating pixel signals representative of the optical image based on the pixel values; and a controller for selectively executing first image-pickup control for reading out first signals from said first cells or second image-pickup control for reading out signals from said second cells in a movie mode, said controller comprising a decision circuit for determining a quantity of light incident to said image sensor;

said controller executing the first control when said decision circuit determines that the quantity of incident light is smaller than a preselected threshold value to thereby establish image-pickup control on a basis of the first signals, wherein, when said decision circuit determines that the quantity of incident light is not smaller than the threshold value, said controller executes the second control.

17. A digital camera for receiving an optical image via a lens and generating image signals representative of the optical image, said digital camera comprising:

an image sensor including a plurality of first cells, which are not provided with color filter segments at a light incidence side, and a plurality of second cells, which are provided with the color filter segments, each of said first and second cells outputting a particular signal corresponding to a quantity of incident light;

a signal processing circuit for processing signals read out from said image sensor for thereby generating pixel values pixel by pixel and generating pixel signals representative of the optical image based on the pixel values; and a controller for selectively executing first image-pickup control for reading out first signals from said first cells or second image-pickup control for reading out signals from said second cells in a movie mode, said controller comprising a decision circuit for determining a quantity of light incident to said image sensor;

said controller executing the first control when said decision circuit determines that the quantity of incident light is smaller than a preselected threshold value to thereby establish image-pickup control on a basis of the first signals, wherein, before executing the image-pickup control, said controller determines whether or not any one of said first cells is a defective cell, excludes the first signal output from the defective one of said first cells, and executes the image-pickup control by using the first signals output from a remainder of said first cells.

18. The digital camera in accordance with claim 13, further comprising a storage storing information relating to said first cells and said second cells, wherein said controller references the information when performing the decision with the first signals and the second signals.

19. The digital camera in accordance with claim 18, wherein said signal processing circuit comprises a circuit for correcting defects of the second signals, and said circuit also executes same defect correction performed with the first signals subjected to the decision by said controller as with the second signals in accordance with the information.

* * * * *